US006972568B2

(12) United States Patent
Haner et al.

(10) Patent No.: US 6,972,568 B2
(45) Date of Patent: Dec. 6, 2005

(54) RADIALLY-COMPACT NMR FLOW CELL ASSEMBLIES AND METHODS

(75) Inventors: Ronald L. Haner, Palo Alto, CA (US); Mark G. Michelin, Palo Alto, CA (US); Daina Avizonis, Redwood City, CA (US)

(73) Assignee: Varian, Inc., Palo Alto, CA (US)

(*) Notice: Subject to any disclaimer, the term of this patent is extended or adjusted under 35 U.S.C. 154(b) by 0 days.

(21) Appl. No.: 10/658,580

(22) Filed: Sep. 9, 2003

(65) Prior Publication Data

US 2005/0052184 A1    Mar. 10, 2005

(51) Int. Cl.$^7$ ............................................. G01V 3/00
(52) U.S. Cl. .................................................. 324/321
(58) Field of Search ................................ 324/300–322

(56) References Cited

U.S. PATENT DOCUMENTS

| | | | | |
|---|---|---|---|---|
| 4,266,194 A | * | 5/1981 | Hlavka ........................ | 324/315 |
| 4,581,583 A | * | 4/1986 | Van Vliet et al. ........... | 324/321 |
| 5,247,256 A | * | 9/1993 | Marek ......................... | 324/321 |
| 5,258,712 A | | 11/1993 | Hofmann et al. | |
| 5,469,061 A | * | 11/1995 | Linehan et al. ............. | 324/321 |
| 5,867,026 A | * | 2/1999 | Haner ......................... | 324/321 |
| 5,977,772 A | * | 11/1999 | Wand et al. ................. | 324/321 |
| 6,177,798 B1 | | 1/2001 | Haner et al. | |
| 6,198,281 B1 | * | 3/2001 | Wand et al. ................. | 324/300 |
| 6,329,820 B1 | * | 12/2001 | Hasegawa et al. .......... | 324/315 |
| 6,362,624 B1 | * | 3/2002 | Wand et al. ................. | 324/321 |
| 6,396,274 B1 | | 5/2002 | Commens et al. | |
| 6,437,570 B2 | * | 8/2002 | Marek ......................... | 324/321 |
| 6,441,617 B2 | * | 8/2002 | Marek ......................... | 324/318 |
| 6,507,191 B1 | * | 1/2003 | Eguchi et al. ............... | 324/318 |
| 2004/0004478 A1 | * | 1/2004 | Hofmann et al. ........... | 324/321 |

OTHER PUBLICATIONS

Article by Barjat et al. entitled "Adaptation of Ceommercial 500 MHz Probes for LCNMR" published by Journal of Magnetic Resonance, Series A 119, pp. 115-119 (1996).

Article by Watanabe et al. entitled "Direct-Coupling of FT_NMR to High Performance Liquid Chromatography" published by PROC. Japan Acad., vol. 54, Ser. B, pp. 194-199. (1978).

Article by HAW et al., entitled "Coninuous Flow High Field Nuclear Magnetic Resonance Detector for Liquid Chromatographic Analysis of Fuel Samples" published by Anal. Chem.1981, vol. 53, pp. 2327-2332.

Article by Albert et al., entitled "Reversed-Phase High-Performance Liquid Chromatography-Nuclear Magnetic Resonance On-Line Coupling With Solvent Non-Excitation" published by Elsevier Science Publishers, B.V., 1989, pp. 355-363.

(Continued)

*Primary Examiner*—Diego Gutierrez
*Assistant Examiner*—Dixomara Vargas
(74) *Attorney, Agent, or Firm*—Bella Fishman; Edward H. Berkowitz (57) ABSTRACT

An NMR flow cell assembly comprises: a flow cell for holding a sample; inlet and outlet sample tubing providing fluidic access to the flow cell; and a pair of connectors connecting the inlet and outlet sample tubing to the flow cell. Each connector is secured to the flow cell by an adhesive region. The adhesive region is separated from the interior of the flow cell by an annular adhesive-separation barrier extending between the flow cell and said each of the pair of connectors. The barrier may be formed by an O-ring, or ridges formed in the flow cell wall. In another embodiment, the flow cell and connector have matching helical threads, and a sealing barrier such an O-ring or ferrule is placed along a transverse end face of the flow cell, such that the sealing force on the flow cell is longitudinal and/or outward.

31 Claims, 4 Drawing Sheets

OTHER PUBLICATIONS

Article by Laude, Jr. et al., entitled "Direct-Linked Analytical Scale High-Performance Liquid Chromatography Nuclear Magnetic Resonance Spectrometry" published by Analytical Chemistry, vol. 56, No. 13, Nov. 1984, pp. 2471-2475.

Article by Bayer et al., entitled "On-Line Coupling of High-Performance Liquid Chromatography and Nuclear Magnetic Resonance" published by Journal of Chromatography, 186 (1979), pp. 497-507.

Article by Forbes, Malcolm, entitled "A Fast 350GHz Time-Resolved EPR Apparatus" published by Rev. Sci. Instrum, vol. 64, No. 2, Feb. 1993, pp. 397-402.

Article by Curran, Sean and Williams, Donald, entitled " Design and Optimization of an NMR Flow Cell for a Commercial NMR Spectrometer", published by Applied Spectroscopy, vol. 41, No. 8, 1987, pp. 1450-1454.

Article by Barjat, H, et al., entitled Adaptation of Commerical 500 MHz Probes for LCNMR, published by Journal of Magentic Resonance, Series A 119, (1996), pp. 115-119.

* cited by examiner

RADIALLY-COMPACT NMR FLOW CELL ASSEMBLIES AND METHODS

FIELD OF THE INVENTION

The invention in general relates to nuclear magnetic resonance (NMR) spectroscopy, and in particular to NMR flow cell assemblies and methods.

BACKGROUND OF THE INVENTION

Nuclear magnetic resonance (NMR) spectrometers typically include a superconducting magnet for generating a static magnetic field $B_0$, and an NMR probe positioned within a bore of the magnet. The NMR probe includes one or more special-purpose radio-frequency (RF) coils for applying a time-varying magnetic field $B_1$, perpendicular to the field $B_0$ to samples of interest, and for detecting the response of the samples to the applied magnetic fields. The samples of interest are normally held in sample tubes or in flow cells. A sample tube or flow cell is positioned within an access bore of the NMR probe, and the probe is inserted into the magnet such that the sample is situated at or near the center of the static magnetic field. The sample temperature can be controlled by flowing air of a given temperature through the NMR probe access bore, along the sample tube or flow cell.

The design of NMR probes and associated flow cells is typically subject to tight spatial constraints. High-resolution NMR magnets have access bores with an inner diameter on the order of a few cm, for example 45 mm, and lengths on the order of 1 meter. Within the NMR probe, the internal access bore typically has an inner diameter of about 1 cm or less, and a length comparable to that of the magnet access bore. In an exemplary commercial implementation, the NMR probe access bore is 0.75 m long and less than 1 cm in diameter. It is generally desirable to minimize the distance between the flow cell and the RF coils because the quality of NMR measurements is directly related to the coil filling factor, or the fraction of coil volume occupied by sample. At the same time, if air flow is used to control the sample temperature, enough space must be left to accommodate the passage of air between the flow cell and the inner probe wall.

In the tight space normally available within the NMR probe, connecting a flow cell to sample inlet and outlet tubing can pose substantial design challenges. One approach to connecting the flow cell to the sample tubing is described by Haner et al. in U.S. Pat. No. 6,177,798. A flow-through NMR probe includes a replaceable NMR flow cell connected to sample tubing using compression-style fittings. The connections described by Haner et al. are inert, and do not interact chemically with the sample. At the same time, the flow tube assembly can have a diameter substantially larger than the diameter of the flow cell itself.

In the article "Adaptation of Commercial 500 MHz Probes for LCNMR," *Journal of Magnetic Resonance* A 119:115–119 (1996), Barjat et al. describe a flow cell assembly in which the flow cell is epoxied to the inlet and outlet tubing. The outer diameter of the resulting assembly, shown in FIG. 2 of Barjat et al., may be defined approximately by the flow cell diameter. At the same time, Barjat et al. report that, at least for some of their cells, compatibility between materials and solvents remains a significant problem, and the epoxy adhesive used is not ideal.

In U.S. Pat. No. 5,258,712, Hoffmann et al. describe a sample head for flowthrough NMR spectroscopy. The parts constituting an NMR vessel, namely a replaceable quartz cuvette, a cylindrical glass casing, a cover, and a base, can be clamped together with a single clamping device, as shown in FIG. 2-A of Hoffmann et al. To replace the a quartz cuvette in the system of Hoffmann et al., an end user would need access to the clamping device, and to the space between the cover and base, so as to remove the old cuvette and place the new cuvette between the cover and base.

SUMMARY OF THE INVENTION

According to one aspect, the present invention provides a nuclear magnetic resonance flow cell assembly for holding a nuclear magnetic resonance sample, comprising: a flow cell for holding the nuclear magnetic resonance sample; inlet and outlet sample flow tubing for providing fluidic access to the flow cell; and a pair of connectors including a first connector for connecting the inlet sample flow tubing to the flow cell, and a second connector for connecting the outlet sample flow tubing to the flow cell. Each of the pair of connectors is secured to the flow cell by an adhesive region, wherein the adhesive region is separated from the interior of the flow cell by an annular adhesive-separation barrier extending between the flow cell and said each of the pair of connectors.

According to another aspect, the present invention provides a nuclear magnetic resonance flow cell assembly for holding a nuclear magnetic resonance sample, comprising: a flow cell for holding the nuclear magnetic resonance sample; sample flow tubing for providing fluidic access to the flow cell; a connector for fluidically connecting the sample flow tubing to the flow cell; and a sealing barrier positioned between a transverse end surface of the flow cell and a transverse surface of the connector. The connector includes a flow cell connector bore sized to accommodate an end region of the flow cell. The flow cell has a first helical thread along a lateral surface of the flow cell. The connector has a second helical thread matching the first helical thread, for screwing the connector to the flow cell. The sealing barrier is pressed between the flow cell and the connector when the flow cell and the connector are screwed together, for sealing an interface between the flow cell and the connector.

BRIEF DESCRIPTION OF THE DRAWINGS

The foregoing aspects and advantages of the present invention will become better understood upon reading the following detailed description and upon reference to the drawings where:

FIG. 2-A shows an isometric view of a flow cell assembly of the spectrometer of FIG. 1-A, according to an embodiment of the present invention.

FIG. 2-B shows a longitudinal sectional view of a part of the flow cell assembly of FIG. 1-A including a connection between a flow cell and sample tubing, according to an embodiment of the present invention.

FIGS. 3-A–C show longitudinal sectional views of exemplary flow cell connection configurations suitable for use with enclosed adhesives, according to embodiments of the present invention.

FIGS. 4-A–C show longitudinal sectional views of exemplary flow cell connection configurations suitable for establishing transverse-face, axial seals, according to embodiments of the present invention.

FIGS. 5-A–C show isometric, transverse sectional and longitudinal sectional views of a connector according to an embodiment of the present invention.

FIG. 5-D shows a longitudinal sectional view of a two-piece connector including the connector of FIGS. 5-A–C and an extension piece, according to an embodiment of the present invention.

DETAILED DESCRIPTION OF THE INVENTION

In the following description, a set of elements includes one or more elements. Any reference to an element is understood to encompass one or more elements. The statement that a coil is used to perform a nuclear magnetic measurement on a sample is understood to mean that the coil is used as transmitter, receiver, or both. A transverse surface need not be perpendicular to the longitudinal axis defined by a flow cell assembly, and may include a tapered surface having a transverse component.

The following description illustrates embodiments of the invention by way of example and not necessarily by way of limitation.

Some NMR probes impose particularly demanding constraints on the design of the associated flow cell assemblies. For example, an exemplary cryogenically-cooled probe design uses a probe bore having half the diameter of a standard room-temperature probe bore. Moreover, a low-temperature probe may not be amenable to convenient removal from the magnet in order to facilitate replacement of the flow cell. For such a probe, the flow cell assembly is preferably replaced while the probe is held within the magnet. Typically, room-temperature probes may be removed from the magnet by an end user, in order to facilitate replacement of the flow cell assembly while the probe is situated on a workbench.

Conventional compression-style fittings as described by Haner et al. in the above-referenced U.S. Pat. No. 6,177,798 may not fit in the inner bores of some NMR probes. It was observed that simply scaling down the size of the compression-style fittings may not make the connectors suitable for use in narrow probe bores. Scaling down the fitting size can weaken the seals established by the fittings, allowing the sample to leak out of the connection. Weakening the seals can be particularly undesirable in applications requiring relatively high sample pressures.

Previously described adhesive-based connection approaches were also observed to be subject to undesirable problems. Swelling of the epoxy due to contact with the sample may make a conventional adhesive-based assembly design, such as the one described by Barjat et al., unacceptably short-lived for commercial applications. Furthermore, contact between epoxy and sample can lead to chemical contamination of analytical samples and flush solvents.

The preferred flow cell assembly configurations described below allow establishing radially-compact, high-longevity, high-sealing-force connections between NMR flow cells and associated sample tubing, without exposing the analytical samples and flush solvents to unacceptably high contamination risks. The flow cell assemblies may be replaced by an end user through the NMR probe central bore while the probe is kept in the NMR spectrometer magnet. The preferred flow cell assemblies are particularly suited for applications subject to tight spatial constraints and/or access limitations, and for high-pressure applications.

Figure 1:
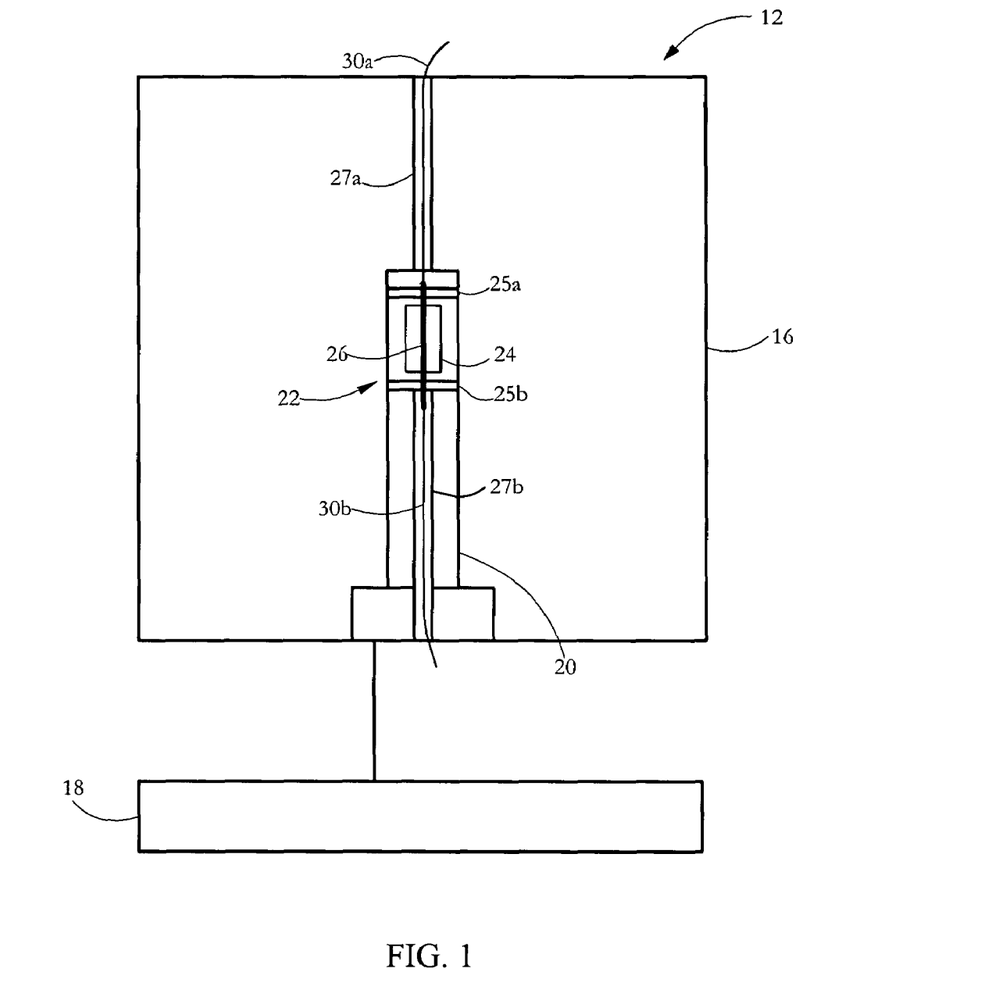
FIG. 1 is a schematic diagram of an exemplary NMR spectrometer according to an embodiment of the present invention.

FIG. 1 is a schematic diagram illustrating an exemplary nuclear magnetic resonance (NMR) spectrometer 12 according to an embodiment of the present invention. Spectrometer 12 comprises a magnet 16, an NMR probe 20 inserted in a cylindrical bore of magnet 16, and a control/acquisition system 18 electrically connected to magnet 16 and probe 20. Magnet 16 includes an access/guide tube 27a, which allows access to NMR probe 20 from the top of magnet 16. Probe 20 includes one or more radio-frequency (RF) coils 24. A flow cell assembly 22 is positioned within probe 20, for holding an NMR sample of interest within coil(s) 24 while measurements are performed on the sample. Flow cell assembly 22 includes a flow cell 26, sample inlet tubing 30b fluidically connected to an inlet end of flow cell 26, and sample outlet tubing 30a fluidically connected to an outlet end of flow cell 26. Sample inlet tubing 30b may be connected to a liquid chromatography (LC) apparatus or another known sample source. In the illustrated configuration, sample outlet tubing 30a extends out of probe 20 on the side opposite sample inlet tubing 30b, through access tube 27a. The sample outlet tubing may also extend back down through probe 20.

An upper support disk 25a and a lower support disk 25b may be used to support flow cell assembly 22, coil(s) 24 and associated components within probe 20. Two guide tubes 27a–b may be provided on opposite sides of disks 25a–b, to facilitate the insertion and removal of probe assembly 22 into and from probe 20. Flow cell assembly 22 may be inserted into and removed from probe 20 from above, through the central apertures defined in support disks 25a–b. An end user may replace flow cell assembly 22 through the central NMR probe bore, while the NMR probe is situated in the NMR magnet. In a present implementation, an end user inserts and removes flow cell assembly 22 from above. In alternative implementations, an end user may insert and/or remove a flow cell assembly from above and/or below.

To perform a measurement, a sample is inserted through inlet tubing 30b into flow cell 26. Magnet 16 applies a static magnetic field $B_0$, to the sample held within flow cell 26. Control/acquisition system 18 comprises electronic components configured to apply desired radio-frequency pulses to probe 20, and to acquire data indicative of the nuclear magnetic resonance properties of the samples within probe 20. Coils 24 are used to apply radio-frequency magnetic fields $B_1$, to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field. Once the desired NMR data has been collected, the sample is removed from flow cell 26 either through inlet tubing 30b or through outlet tubing 30a. A flushing solvent is run through tubing 30a–b and flow cell 26, to clean flow cell assembly 22 before another NMR sample is inserted.

Figure 2:
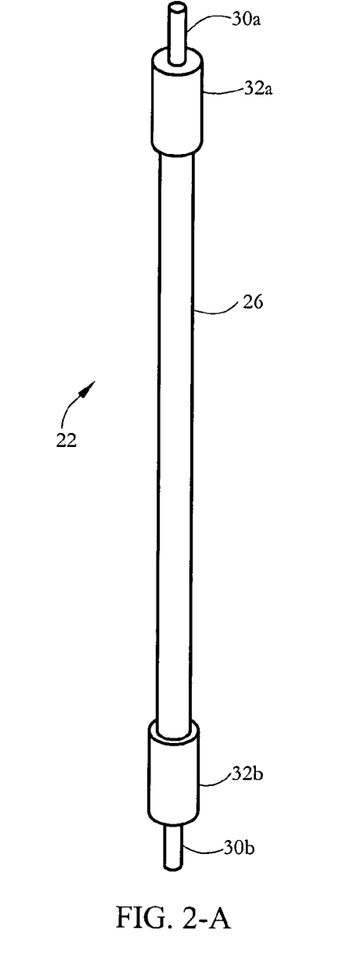

FIG. 2-A shows an isometric view of flow cell assembly 22, while FIG. 2-B shows a longitudinal sectional view of an interconnect region of flow cell assembly 22, at the interface between flow cell 26 and outlet tubing 30a, according to an embodiment of the present invention. A connection configuration similar to that shown in FIG. 2-B may be used at the interface between flow cell 26 and inlet tubing 30b. Flow cell 26 is connected to inlet and outlet sample tubing 30a–b through corresponding connectors 32a–b. Each connector 32a–b may have longitudinal channels defined on its outer surface, to allow temperature control gas (e.g. air or nitrogen) to flow longitudinally along flow cell 26. One or both of connectors 32a–b may be used to attach flow cell assembly 22 to the support structure of probe 20. For example, connector 32a–b may rest on a matching tapered (e.g. frusto-conical) surface defined by upper support disk 25a, shown in FIG. 1.

As shown in FIG. 2-B, flow cell 26 defines a sample-holding chamber 33 for holding the sample of interest, and an access channel 34 extending between sample-holding chamber 33 and an external opening 36. Access channel 34 has a smaller inner diameter than sample-holding chamber 33. The thicker wall of flow cell 26 at its ends provides increased mechanical stability to flow cell 26. Outlet connector 32a fluidically connects outlet tubing 30a to flow cell 26. Connector 32a has a lateral wall enclosing a cylindrical flow-cell connector bore 40, a cylindrical sample tubing connector bore 44, and an annular block 46 separating the two opposite bores 40, 42. Flow cell connector bore 40 is sized to accommodate an end region of flow cell 26, while sample tubing connector bore 44 is sized to accommodate an end region of outlet tubing 30a. Annular block 46 has a central longitudinal aperture 48 extending therethrough, for allowing the passage of sample fluid.

Flow cell 26 is secured to connector 32a by an enclosed adhesive 50 situated between the outer surface of flow cell 26 and the inner surface of connector bore 40. Adhesive 50 is bounded at opposite longitudinal ends by two annular, transverse barriers extending from the outer surface of flow cell 26 to the inner surface of connector bore 40. The annular barriers are preferably formed by O-rings 52a–b. O-rings 52a–b are partially enclosed within corresponding annular counterbores (grooves) 53a–b formed in connector 32a along the inner surface of connector bore 40. The depth of counterbores 53a–b (the enclosed radial extent of O-rings 52a–b) is preferably between ¼ and ¾ of the cross-section of O-rings 52a–b. An internal O-ring 52a isolates adhesive 50 from the sample liquid flowing through flow cell 26. An external O-ring 52b provides an additional barrier between the sample liquid and the exterior of flow cell 26, and centers flow cell 26 within connector bore 40 during the process of attaching flow cell 26 to connector 32a. Additional adhesive 51 situated outside O-ring 52b further secures flow cell 26 to connector 32a.

Similarly, tubing 30a is secured to connector 32a by an enclosed adhesive 60 situated between the outer surface of tubing 30 and the inner surface of connector bore 42. Adhesive 60 is enclosed at opposite longitudinal ends by O-rings 62a–b. O-rings 62a–b are partially enclosed within corresponding annular counterbores 63a–b formed in connector 32a along the inner surface of connector bore 44. Additional adhesive 61 is provided outside O-ring 62b. The configuration described above may be used for one or both of inlet and outlet connectors 32a–b.

Flow cell 26 is preferably made of an NMR-compatible material such as quartz, borosilicate glass (Pyrex®), sapphire, ceramic, or high-performance plastic. Tubing 30a–b is preferably made of a flexible LC-compatible material such as polyetheretherketone (PEEK), polytetrafluoroethylene (PTFE, or Teflon®) or fused silica. Tubing 30a–b may also be made of a rigid material such as stainless steel. Connectors 32a–b may be made of polyetheretherketone, polytetrafluoroethylene, chlorotrifluoroethylene (CTFE, or Kel-F®), or other LC-compatible materials. The adhesive used to secure flow cell 26 and tubing 30a–b to connector 32 may be a two part adhesive such as an epoxy adhesive, e.g. EPON® high-performance epoxy. O-rings 52a–b, 62a–b, may be made of inert, non-absorbent materials such as fluorocarbons/perfluoroelastomers, e.g. Simriz®.

The dimensions of flow cell 26, tubing 30a–b, and connector 32 may be chosen according to the particular NMR application envisioned. In an exemplary configuration, flow cell 26 may have an outer diameter of about 2–5 mm, an inner diameter at its ends of about 0.5–1 mm, and a length of 10–20 cm. Tubing 30 may have an outer diameter of about 1–3 mm, and an inner diameter of 0.1–0.5 mm. Connector 32 may have an outer wall thickness of 0.25–2.5 mm, and a longitudinal extent of 2.5–75 mm. The longitudinal extent covered by adhesive may be 5 to 40 mm. O-rings 52a–b, 62a–b may have a transverse cross-section on the order about 1 to 2 mm and an inside diameter on the order of about 0.5 to 3 mm.

Flow cell assembly 22 may be assembled outside probe 20, by inserting O-rings 52a–b, 62a–b into corresponding connector bores 50, 44 and positioning the O-rings 52a–b, 62a–b into the corresponding annular counterbores 53a–b, 63a–b. Adhesive is disposed evenly along the internal lateral surface between the internal O-rings 52a, 62a and their corresponding external O-rings 52b, 62b. Flow cell 26 and tubing 30a–b are inserted into the corresponding bores of connectors 32a–b through the inner diameters of the O-rings 52a–b, 62a–b. During assembly, internal O-rings 52a, 62a restrict uncured adhesive from transferring into the bottom-regions of the connector bores 40, 44 and once the adhesive has cured, O-rings 52a, 62a isolate the adhesive from sample fluids inserted into flow cell 26. After the adhesive has cured, flow cell assembly 22 may be inserted into probe 20 through guide tube 27, and secured to upper support disk 25a and/or lower support disk 25b (shown in FIG. 1). A sample of interest is then inserted into flow cell 26 through inlet tubing 30a, and removed from flow cell 26 either through inlet tubing 30b or through outlet tubing 30a. Flushing solvent may also be run through flow cell 26, to clean flow cell 26.

Figure 3:
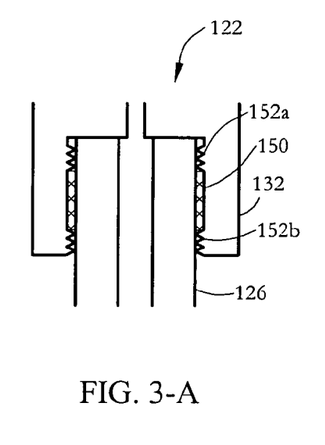

FIG. 3-A shows a longitudinal sectional view of part of a flow cell assembly 122 including the interface between a flow cell 126 and a connector 132, according to another embodiment of the present invention. Connector 132 includes two sets of radial ridges 152a–b sized to accommodate flow cell 126 in a sliding fit. Ridges 152a–b are preferably integrally formed with connector 132, i.e. are part of a single monolithic structure. Alternatively, ridges 152a–b may be provided as part of one or two sleeves secured to connector 132. An adhesive 150 binds flow cell 126 to connector 132 along a surface bounded longitudinally by ridges 152a–b. Ridges 152a–b act as barriers preventing the contact of adhesive 150 with fluids such as samples or flushing solvents. Using two set of ridges also provides for centering flow cell 126 within connector 132. In an exemplary implementation, each set of ridges 152a–b may have a transverse size of 0.25 to 1.25 mm, and extend over a length of 2.5–12.5 mm. A ridged contact surface as described above may also be used to provide isolation for the adhesive used to secure the sample inlet and/or outlet tubing. Adhesive-isolation ridges positioned as described above may also be provided on the outer surface of a flow cell and/or sample tubing, instead of or in addition to ridges provided on the inner surface of a connector. Adhesive-isolation barriers comprising ridges may be more difficult to manufacture than O-rings, but may simplify the flow cell assembly by eliminating the need to place O-rings during the assembly process. Furthermore, using ridges reduces the potential for sample contamination that may be introduced by the use of O-rings.

FIG. 3-B shows a longitudinal sectional view of part of a connector 232 according to another embodiment of the present invention. Connector 232 includes a generally-radial adhesive-insertion channel 255 extending from the external surface of connector 232 to the internal surface of one of the bores of connectors 232. Connector 232 may include multiple such channels disposed at different azimuthal locations along connector 232. Such channels may be used to inject adhesive in the connection space defined between connector 232, the outer surface of a flow cell or sample tubing, and radial barriers formed by O-rings or ridges as described above. In an exemplary implementation, channel 255 may have a diameter of about 0.25–1.25 mm FIG. 3-C shows a connector 332 having an annular counterbore (groove) 355 serving as an adhesive reservoir. Counterbore 355 has a semi-circular longitudinal cross-section. Counterbore 355 is positioned along the connection space defined between connector 332, the outer surface of a flow cell or sample tubing, and radial barriers formed by O-rings or ridges as described above. Counterbore 355 may be connected to an adhesive insertion channel such as the one shown in FIG. 3-B. In an exemplary implementation, counterbore 355 may have a depth of about 0.1–1 mm, for example about 0.5 mm. A suitable counterbore may be helical rather than planar. A helical counterbore may be conveniently formed in connector 332 by twisting a tapping tool within the corresponding connector bore of connector 332. An annular or helical adhesive-holding counterbore reduces the risk that adhesive is completely squeezed out of some azimuthal section of the contact surface defined between connector 332 and its corresponding flow cell or sample tubing. Such a counterbore thus facilitates establishing a uniform, secure connection between connector 332 and the flow cell or sample tubing. An annular or helical sample-holding reservoir as described above may also be defined along the outer surface of a flow cell or sample tubing, rather than along the inner surface of connector 332.

Figure 4:
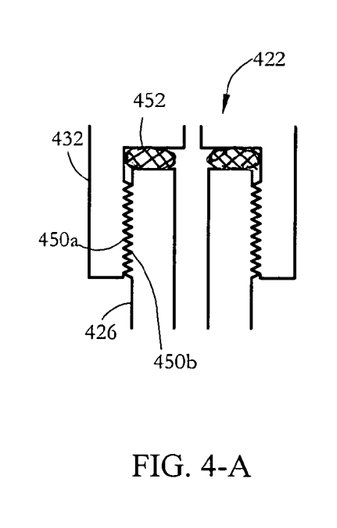

FIG. 4-A shows a longitudinal sectional view of part of a flow cell assembly 422 including the interface between a flow cell 426 and a connector 432, according to another embodiment of the present invention. Connector 432 and flow cell 426 have matching helical threads 450a–b defined along a lateral internal bore surface of connector 432 and a lateral external surface of flow cell 426, respectively. Connector 432 has a section of its lateral internal bore surface without threads that serves as an O-ring groove 462. Connector 432 laterally encloses flow cell 426 along a longitudinal end section of flow cell 426. An O-ring 452 is disposed between flow cell 426 and connector 432 along a transverse end face of flow cell 426. O-ring 452 is pressed between flow cell 426 and connector 432 as the two parts are screwed together. FIG. 4-A depicts the O-ring under compression as its cross-section is distorted somewhat from the uncompressed circular cross-section typical of commercial O-rings. In the present embodiment, the dimension of the outer diameter of the uncompressed O-ring 452 is selected to fit closely with the inner wall of the O-ring groove 462 of connector 432 so that the transverse position of the O-ring 452 does not shift significantly during assembly and compression. In the present embodiment, the dimension of the inner diameter of the uncompressed O-ring 452 is selected so that its inner diameter under compression is approximately equal to the inner diameter of the flow cell 426. The selection of the inner and outer diameters of O-ring 452 reduces the possibility of restriction or blockage of fluid flow due to any overlap with the inner diameter of the flow cell 426. Also, this selection of the inner diameter of the O-ring 452 minimizes the volume of the axial gap 472 between the connector 432 and flow cell 426. The optimal design of the inner and outer diameters of O-ring 452 provides maximum contact area along the transverse end surfaces of connector 432 and flow cell 426 for a stronger seal. O-ring 452 is preferably sufficiently slippery such that it is not subject to excessive torsional forces as flow cell 426 and connector 432 are screwed together. The sealing force on O-ring 452 and flow cell 426 is longitudinal. O-ring 452 establishes a leak-resistant seal between flow cell 426 and connector 432. Placing the sealing interface along a transverse surface, rather than a lateral surface, allows a reduction in the lateral pressure needed to establish the seal.

FIG. 4-B shows a longitudinal sectional view of part of a flow cell assembly 522 including the interface between a flow cell 526 and a connector 532, according to another embodiment of the present invention. Flow cell assembly 522 differs from the assembly 452 shown in FIG. 4-A in that a ferrule 552 is used instead of an O-ring 452 to establish a leak-resistant seal between the flow cell and connector. The sealing force on ferrule 552 and flow cell 526 has a longitudinal component, and a transverse outward-directed component. Exemplary suitable materials for ferrule 552 include Tefzel®, PEEK, Kel-F®, and PTFE. In an exemplary embodiment, ferrule 552 may have an inner diameter of about 2.5–5 mm, e.g. 3.2 mm, and an outer diameter of 2.5 to 12.5 mm, e.g. 4 mm. Relative to O-rings, ferrules may pose a lesser risk of absorbing and releasing contaminants.

FIG. 4-C shows a longitudinal sectional view of part of a flow cell assembly 622 including the interface between a flow cell 626 and a connector 632, according to another embodiment of the present invention. Sample tubing 630 may be secured within connector 632 by known methods. Connector 632 and flow cell 626 have matching helical threads 650a–b defined along a lateral external surface of connector 632 and a lateral internal bore of flow cell 626, respectively. Flow cell 626 laterally encloses connector 632 along a longitudinal end section of flow cell 626. A ferrule 652 laterally encloses sample tubing 630, and has a tapered external distal surface matching a corresponding tapered, transverse internal bore surface 654 of flow cell 626. Ferrule 652 is pressed onto sample tubing 630 as connector 632 and flow cell 626 are screwed together. As the two parts are screwed together, ferrule 652 is pressed between the lower transverse surface of connector 632 and the tapered surface 654 of flow cell 626. Alternatively, an inward-facing transverse tapered surface may be provided along the bottom of connector 632, with the orientation of the tapered surface and the ferrule upside-down with respect to the orientation shown in FIG. 4-C.

According to another embodiment of the present invention, the threaded connection configuration of FIG. 4-A is employed at the interface between a connector and a flow cell, while the enclosed-adhesive configuration of FIG. 2-B is employed at the interface between the connector and corresponding sample tubing. For sample tubing having a relatively small diameter, it may be difficult to define a thread in the sample tubing wall. Such a thread may be easier to form in the outer wall of a flow cell, which typically has a larger diameter than corresponding sample tubing.

Figure 5:
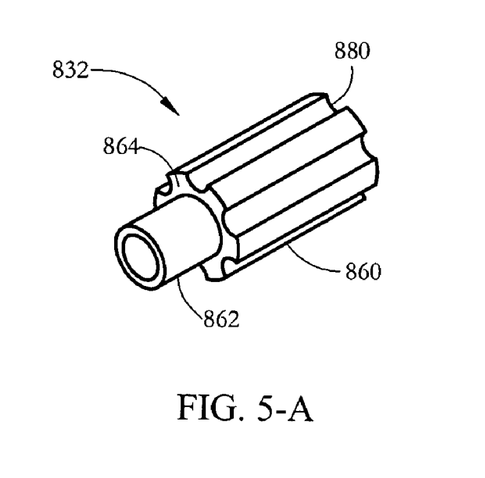

FIG. 5-A shows an isometric view of a connector 832 according to another embodiment of the present invention. FIGS. 5-B–C show transverse and longitudinal sectional views of connector 832. Connector 832 includes a main body 860 and a tubular lateral cover 862 having a smaller transverse size than body 860. A transverse end surface 864 of body 860 may rest on a tapered transverse surface of a support disk. A plurality of longitudinal temperature-control gas channels 880 are defined along the outer surface of body 860, for allowing temperature-control gas to pass along connector 832. As shown in FIG. 5-C, a flow cell connector bore 840 facing one end of connector 832b is sized to accommodate a corresponding flow cell, while a sample tubing connector bore 842 facing the other connector end is sized to accommodate corresponding sample tubing. A helical connection thread 850 is defined in the proximal (inner) region of flow cell connector bore 840, for mating with a corresponding flow cell helical thread. The sample tubing may be connected to connector 832 using a thread or enclosed adhesive, as described above.

FIG. 5-D shows a longitudinal sectional view of a two-piece connector 932 incorporating connector 832 and a tubular extension part 933 secured to connector 832. Extension part 933 laterally encloses tubular extension 862, and may be secured to tubular extension 862 by adhesive. Extension part 933 has a terminal tapered outer surface 935 at its distal end. A plurality of temperature-control gas channels extend along extension part 933, including along tapered surface 935. Each temperature control gas channel along extension part 933 and a corresponding temperature control gas channel along connector 832 forms part of a longer channel extending over the entire longitudinal extent of connector 932. Outer surface 935 may rest on matching tapered surface of a support disk. Extension part 933 permits centering a standard flow cell having a predetermined length in the sweet spot of a given NMR probe. A two-part design is preferred for connector 932 in order to facilitate the machining of thread 850 along the inner surface of connector 832. Machining a helical thread inside a deep bore may be difficult in practice. Thread 850 may be machined before connector 832 and extension part 933 are secured together. A two-piece connector design as shown in FIG. 5-D may also be used in an isolated-adhesive flow cell assembly as shown in FIG. 2-A, to facilitate the step of securing the connector to the flow cell and/or sample tubing. A thread may also be defined along the inner surface of extension 862.

The preferred enclosed-adhesive and end-face sealing connection designs described above allow reliable operation of NMR flow cell assemblies for extended time periods, while allowing an end user to conveniently replace the flow cell assemblies under tight spatial constraints. A connection design similar to that illustrated in FIG. 2-B, held motionless and without adhesive, was observed to operate without a leak for a period of three months at atmospheric pressure. The preferred designs described above also allow operation of NMR flow cell assemblies at high pressures, e.g. above 3 MPa, and insertion and removal of the flow cell assemblies into and out of an NMR probe maintained inside the NMR magnet. The preferred threaded designs also allow an end user to assemble and reassemble the described assemblies in the field.

The above embodiments may be altered in many ways without departing from the scope of the invention. For example, the isolated-adhesive and end-face seal connections described above may be used at the flow cell and/or sample tubing connector ends. Adhesive may be used in conjunction with a threaded connection. A single O-ring, or more than two O-rings or other barriers may be employed between a connector and a flow cell or sample tubing. The directions of sample flow described above may be reversed. For example, the inlet tubing may be provided from above the flow cell, and the corresponding outlet tubing may be provided below or above the flow cell. Temperature-control gas channels extending along a connector may run through a connector, and/or along the external surface of the connector. Accordingly, the scope of the invention should be determined by the following claims and their legal equivalents.

What is claimed is:

1. A nuclear magnetic resonance flow cell assembly for holding a nuclear magnetic resonance sample fluid, comprising:
   a flow cell for holding the nuclear magnetic resonance sample fluid, said flow cell comprising an outer surface and an inner surface, said inner surface in contact with said fluid sample;
   sample flow tubing for providing fluidic access to the flow cell;
   a connector for fluidically connecting the sample flow tubing to the flow cell;
   a flow cell adhesive securing a lateral surface of the flow cell to surface of the connector; and
   an internal flow cell adhesive-separation barrier extending between the surface of the flow cell and the surface of the connector, positioned to separate the flow cell adhesive from an interior surface of the flow cell whereby said adhesive is isolated from contact with said sample fluid.

2. The flow cell assembly of claim 1, wherein the internal flow cell adhesive-separation barrier comprises an O-ring.

3. The flow cell assembly of claim 1, wherein the internal flow cell adhesive-separation barrier comprises a plurality of annular ridges.

4. The flow cell assembly of claim 3, wherein the plurality of annular ridges are integrally formed with the connector.

5. The flow cell assembly of claim 1, further comprising an external flow cell adhesive-separation barrier extending between the outer surface of the flow cell and the inner surface of the connector, positioned to separate the flow cell adhesive from an external environment of the flow cell, and to center the flow cell with respect to connector.

6. The flow cell assembly of claim 1, wherein the connector includes:
   a lateral wall enclosing a flow cell connector bore sized to accommodate an end region of the flow cell, wherein the flow cell adhesive is situated along the flow cell connector bore; and
   an annular stop for constraining the flow cell longitudinally when the flow cell is positioned in the flow cell connector bore.

7. The flow cell assembly of claim 1, wherein the flow cell assembly further includes:
   a sample flow tubing adhesive securing a lateral outer surface of the sample flow tubing to an inner surface of the connector, and
   an internal sample flow tubing adhesive-separation barrier extending between the outer surface of the sample flow tubing and the inner surface of the connector, positioned to separate the sample flow tubing adhesive from an interior of the sample flow tubing.

8. The flow cell assembly of claim 1, wherein the connector comprises a radial adhesive-insertion channel extending from an outer surface of the connector to an inner surface of the connector along the flow cell connector bore.

9. The flow cell assembly of claim 1, wherein the connector comprises an adhesive-holding reservoir extending along an adhesive interface between the flow cell and the connector.

10. The flow cell assembly of claim 9, wherein the adhesive-holding reservoir is annular.

11. The flow cell assembly of claim 9, wherein the adhesive-holding reservoir is helical.

12. The flow cell assembly of claim 1, wherein the connector comprises a plurality of longitudinal channels defined along the connector, for allowing a passage of a temperature-control control gas along the connector.

13. A nuclear magnetic resonance flow cell assembly for holding a nuclear magnetic resonance sample fluid, comprising:
 a flow cell for holding the nuclear magnetic resonance sample, said flow cell comprising an inner surface, said inner surface in contact with said fluid sample;
 inlet and outlet sample flow tubing for providing fluidic access to the flow cell; and
 a pair of connectors including a first connector for connecting the inlet sample flow tubing to the flow cell, and a second connector for connecting the outlet sample flow tubing to the flow cell, each of the pair of connectors being secured to the flow cell by an adhesive region, wherein the adhesive region is separated from an interior surface of the flow cell by an annular adhesive-separation barrier extending between the flow cell and said each of the pair of connectors and said adhesive is isolated from contact with said sample fluid.

14. The flow cell assembly of claim 13, wherein the adhesive-separation barrier comrises an O-ring.

15. The flow cell assembly of claim 13, wherein the adhesive-separation barrier comprises a plurality of annular ridges.

16. A nuclear magnetic resonance probe comprising:
 a nuclear magnetic resonance flow cell assembly for holding a nuclear magnetic resonance sample fluid, comprising:
  a flow cell for holding the nuclear magnetic resonance sample, said flow cell comprising an inner surface, said inner surface in contact with said fluid sample;
  inlet and outlet sample flow tubing for providing fluidic access to the flow cell;
  a pair of connectors including a first connector for connecting the inlet sample flow tubing to the flow cell, and a second connector for connecting the outlet sample flow tubing to the flow cell, each of the pair of connectors being secured to the flow cell by an adhesive region, wherein the adhesive region is separated from an interior surface of the flow cell by an annular adhesive-separation barrier extending between the flow cell and said each of the pair of connectors whereby said adhesive is isolated from contact with said sample fluid; and
 a set of nuclear magnetic resonance coils coupled to the flow cell assembly, for performing a nuclear magnetic resonance measurement on the sample.

17. A nuclear magnetic resonance method comprising:
 inserting a nuclear magnetic resonance sample fluid into a nuclear magnetic resonance flow cell assembly comprising
  a flow cell for holding the nuclear magnetic resonance sample, said flow cell comprising an inner surface, said inner surface in contact with said fluid sample;
  inlet and outlet sample flow tubing for providing fluidic access to the flow cell;
  a pair of connectors including a first connector for connecting the inlet sample flow tubing to the flow cell, and a second connector for connecting the outlet sample flow tubing to the flow cell, each of the pair of connectors being secured to the flow cell by an adhesive region, wherein the adhesive region is separated from an interior surface of the flow cell by an annular adhesive-separation barrier extending between the flow cell and said each of the pair of connectors whereby said adhesive is isolated from contact with said sample fluid; and
 performing a nuclear magnetic resonance measurement on the sample fluid while the sample fluid is situated in the flow cell.

18. The method of claim 17, further comprising inserting the flow cell assembly into a nuclear magnetic resonance probe through a central bore of the nuclear magnetic resonance probe while the nuclear magnetic resonance probe is positioned in a nuclear magnetic resonance magnet.

19. The method of claim 18, further comprising removing the flow cell assembly from the nuclear magnetic resonance probe through the central bore while the nuclear magnetic resonance probe is positioned in the nuclear magnetic resonance magnet.

20. A nuclear magnetic resonance flow cell assembly for holding a nuclear magnetic resonance sample fluid, comprising:
 a flow cell for holding the nuclear magnetic resonance sample fluid said flow cell having an internal surface in contact with said fluid sample, the flow cell having a first helical thread along a lateral surface of the flow cell;
 sample flow tubing for providing fluidic access to the flow cell;
 a connector for fluidically connecting the sample flow tubing to the flow cell, the connector including a flow cell connector bore sized to a accommodate an end region of the flow cell, the connector having a second helical thread matching the first helical thread, for securing the connector to the flow cell; and
 a sealing barrier positioned between a transverse end surface of the flow cell and a transverse surface of the connector, the sealing barrier being pressed between the flow cell and the connector when the flow cell and the connector are secured together, for sealing an interface between the flow cell and the connector whereby said adhesive is isolated from contact with said sample fluid.

21. The flow cell assembly of claim 20, wherein the sealing barrier comprise an O-ring.

22. The flow cell assembly of claim 20, wherein the sealing barrier comprises a ferrule.

23. The flow cell assembly of claim 20, wherein the connector laterally encloses the flow cell along at least part of the second helical thread.

24. The flow cell assembly of claim 20, wherein the flow cell laterally encloses the connector along at least part of the first helical thread.

25. The flow cell assembly of claim 20, wherein the connector comprises a connector body, and a distinct tubular extension part secured to the connector body.

26. The flow cell assembly of claim 25, wherein the tubular extension part has a tapered outer surface at a distal end of the tubular extension part.

27. The flow cell assembly of claim 20, wherein the connector comprises a plurality of longitudinal channels defined along an outer surface of the connector, for allowing a passage of a temperature-control gas along the connector.

28. A nuclear magnetic resonance probe comprising:
 a nuclear magnetic resonance flow cell assembly for holding a nuclear magnetic resonance sample fluid, comprising:

a flow cell for holding the nuclear magnetic resonance sample fluid, said flow cell having an internal surface in contact with said fluid sample, the flow cell having a first helical thread along a lateral surface of the flow cell;

sample flow tubing for providing fluidic access to the flow cell;

a connector for fluidically connecting the sample flow tubing to the flow cell, the connector including a flow cell connector bore sized to accommodate an end region of the flow cell, the connector having a second helical thread matching the first helical thread, for screwing the connector to the flow cell; and a sealing barrier positioned between a transverse end surface of the flow cell and a transverse surface of the connector, the sealing barrier being pressed between the flow cell and the connector when the flow cell and the connector are screwed together, for sealing an interface between the flow cell and the connector whereby said adhesive is isolated from contact with said sample fluid; and a set of nuclear magnetic resonance coils coupled to the flow cell assembly, for performing a nuclear magnetic resonance measurement on the sample fluid.

29. A nuclear magnetic resonance method comprising:

inserting a nuclear magnetic resonance sample into a nuclear magnetic resonance flow cell assembly comprising a flow cell for holding the nuclear magnetic resonance sample, the flow cell having a first helical thread along a lateral surface of the flow cell;

sample flow tubing for providing fluidic access to the flow cell;

a connector for fluidically connecting the sample flow tubing to the flow cell, the connector including a flow cell connector bore sized to accommodate an end region of the flow cell, the connector having a second helical thread matching the first helical thread, for securing the connector to the flow cell; and a sealing barrier positioned between a transverse end surface of the flow cell and a transverse surface of the connector, the sealing barrier being pressed between the flow cell and the connector when the flow cell and the connector are secured together, for sealing an interface between the flow cell and the connector whereby said adhesive is isolated from contact with said sample fluid; and performing a nuclear magnetic resonance measurement on the sample while the sample fluid is situated in the flow cell.

30. The method of claim 29, further comprising inserting the flow cell assembly into a nuclear magnetic resonance probe through a central bore of the nuclear magnetic resonance probe while the nuclear magnetic resonance probe is positioned in a nuclear magnetic resonance magnet.

31. The method of claim 30, further comprising removing the flow cell assembly from the nulear magnetic resonance probe through the central bore while the nuclear magnetic resonance probe is positioned in the nuclear magnetic resonance magnet.

* * * * *